(12) United States Patent
Uchida et al.

(10) Patent No.: US 10,958,055 B2
(45) Date of Patent: Mar. 23, 2021

(54) CIRCUIT ASSEMBLY AND ELECTRICAL JUNCTION BOX

(71) Applicants: AutoNetworks Technologies, Ltd., Mie (JP); Sumitomo Wiring Systems, Ltd., Mie (JP); Sumitomo Electric Industries, Ltd., Osaka (JP)

(72) Inventors: Koki Uchida, Mie (JP); Yukinori Kita, Mie (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 95 days.

(21) Appl. No.: 16/473,310

(22) PCT Filed: Dec. 13, 2017

(86) PCT No.: PCT/JP2017/044679
§ 371 (c)(1),
(2) Date: Jun. 25, 2019

(87) PCT Pub. No.: WO2018/123584
PCT Pub. Date: Jul. 5, 2018

(65) Prior Publication Data
US 2020/0099208 A1    Mar. 26, 2020

(30) Foreign Application Priority Data
Dec. 28, 2016  (JP) .............................. JP2016-254825

(51) Int. Cl.
*H02G 3/16*      (2006.01)
*H05K 1/02*      (2006.01)
(Continued)

(52) U.S. Cl.
CPC ................ *H02G 3/16* (2013.01); *H05K 1/02* (2013.01); *H05K 1/18* (2013.01); *G01R 15/20* (2013.01)

(58) Field of Classification Search
CPC ............ H05K 1/18; H05K 1/181; H05K 1/05; H02G 3/16; G01R 15/20
See application file for complete search history.

(56) References Cited

U.S. PATENT DOCUMENTS

2009/0301765 A1\* 12/2009 Strauss ................ H05K 1/0207
174/252
2011/0096495 A1\* 4/2011 Heise ................... H05K 1/0263
361/688
(Continued)

FOREIGN PATENT DOCUMENTS

JP    S55-100674 U    7/1980
JP    H2-074113 A     3/1990
(Continued)

OTHER PUBLICATIONS

International Search Report, Application No. PCT/JP2017/044679, dated Mar. 6, 2018. ISA/Japan Patent Office.

*Primary Examiner* — Timothy J Thompson
*Assistant Examiner* — Amol H Patel
(74) *Attorney, Agent, or Firm* — Honigman LLP

(57) ABSTRACT

A circuit assembly includes a busbar substrate with busbars and a resin part that is in intimate contact with the busbars, a press-fit member that is made of metal with a thickness greater than the thickness of the busbars, and is press-fitted in the busbar substrate, an electronic component connected to the press-fit member, solder that connects the busbars and the press-fit member, and a solder accumulating portion that is formed with the resin part, and in which the solder is accumulated.

9 Claims, 16 Drawing Sheets

(51) Int. Cl.
*H05K 1/18* (2006.01)
*G01R 15/20* (2006.01)

(56) References Cited

U.S. PATENT DOCUMENTS

| | | | |
|---|---|---|---|
| 2018/0027667 A1* | 1/2018 | Bueyuekgoez | H05K 1/0206 174/250 |
| 2018/0062059 A1* | 3/2018 | Kichima | F21V 29/70 |
| 2019/0139882 A1* | 5/2019 | Sato | H05K 7/209 |

FOREIGN PATENT DOCUMENTS

| | | |
|---|---|---|
| JP | 2011-159727 A | 8/2011 |
| JP | 2015-047032 A | 3/2015 |

* cited by examiner

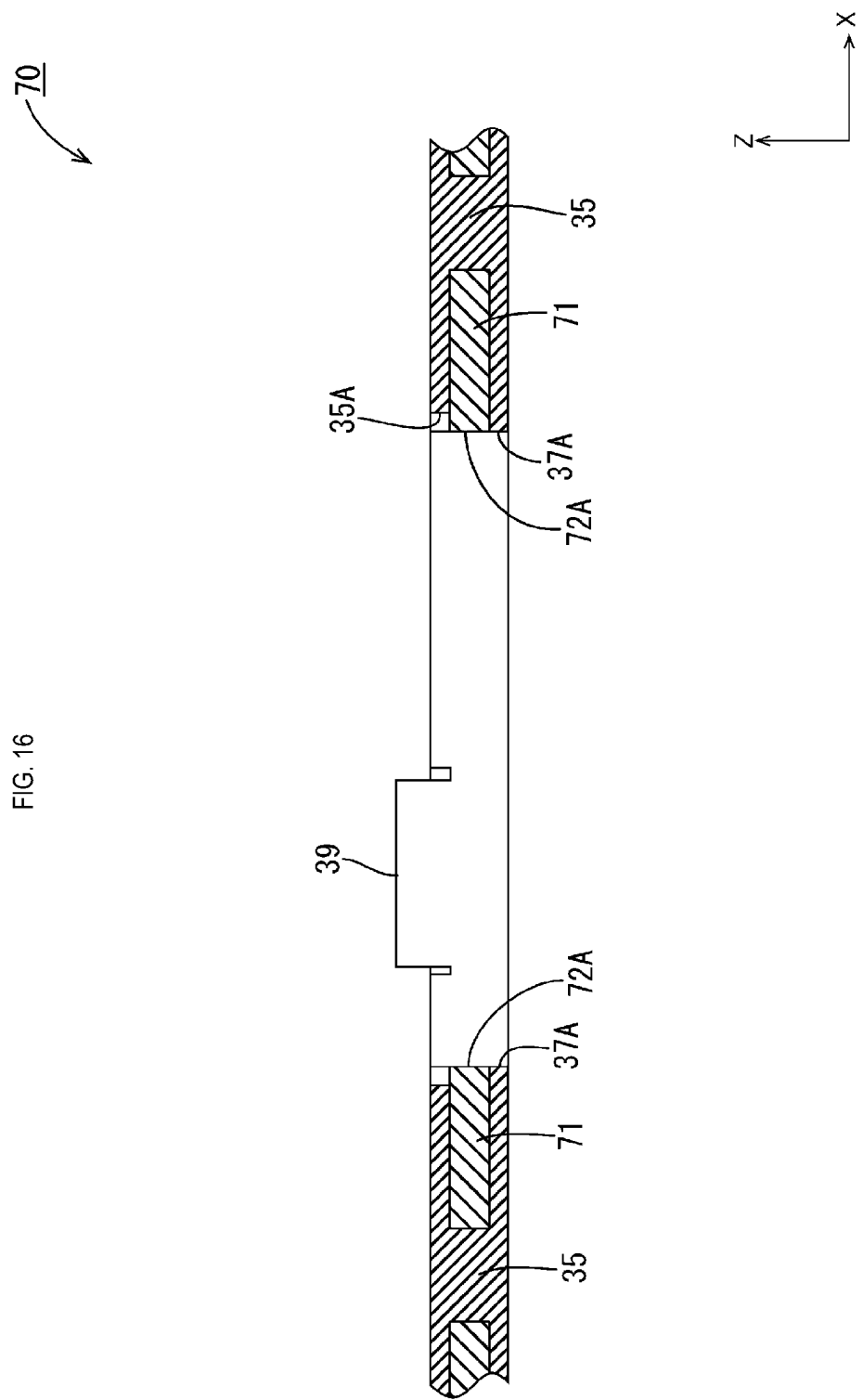

CIRCUIT ASSEMBLY AND ELECTRICAL JUNCTION BOX

CROSS-REFERENCE TO RELATED APPLICATIONS

This application is the U.S. national stage of PCT/JP2017/044679 filed on Dec. 13, 2017, which claims priority of Japanese Patent Application No. JP 2016-254825 filed on Dec. 28, 2016, the contents of which are incorporated herein.

TECHNICAL FIELD

The present specification discloses a technology relating to a circuit assembly and an electrical junction box.

BACKGROUND

Conventionally, a technique for press-fitting metal into a substrate is known. JP 2011-159727A discloses a substrate in which resin layers and conductive layers made of thick copper are alternately stacked on each other, and a copper inlay that is press-fitted into a through-hole formed in the substrate. When being press-fitted into the through-hole formed in the substrate, the copper inlay abuts against retaining parts that protrude from the conductive layers toward the center of the through-hole so that the retaining parts are folded, and thus the copper inlay and the retaining parts remain in contact with each other.

Meanwhile, in the above-described configuration, the retaining parts protruding from the conductive layers are folded by the copper inlay, but if the conductive layers are made of, instead of thick copper, a busbar made of a metal plate material, the busbar is not likely to be folded when the copper inlay is press-fitted. Accordingly, a configuration is conceivable in which the inlay is press-fitted into a through-hole formed in the busbar when the busbar and the inlay is connected to each other, but in this case, a defect may occur in the connection between the inlay and the busbar unless they have high dimensional accuracy, causing a concern that reliability in the connection between the inlay and the busbar is reduced.

The technique disclosed in the present specification has been accomplished in view of the aforementioned circumstances, and it is an object thereof to improve the reliability in connection between a busbar and a press-fit member.

SUMMARY

A circuit assembly described in the present specification includes: a busbar substrate with a busbar and a resin part that is in intimate contact with the busbar; a press-fit member that is made of metal and is press-fitted in the busbar substrate; an electronic component connected to the press-fit member; solder that connects the busbar and the press-fit member; and a solder accumulating portion that is formed with the resin part and in which the solder is accumulated.

According to this configuration, the busbar and the press-fit member are connected to each other via the solder accumulated in the solder accumulating portion, and thus it is possible to improve the reliability in the connection between the busbar and the press-fit member. Furthermore, the solder accumulating portion is formed with the resin part that is in intimate contact with the busbar, and thus it is possible to easily form the solder accumulating portion, and easily change the shape of the solder accumulating portion, so that the degree of freedom in design can increase.

As embodiments of the technique described in the present specification, the following aspects are preferred.

The resin part may include a protrusion portion that protrudes from an end edge of the busbar beyond the busbar, and the press-fit member may be press-fitted to the protrusion portion.

With this, it is possible to suppress a press-fitting defect that may occur due to an error in assembly accuracy, compared to a configuration in which the press-fit member is directly press-fitted to the busbar.

The resin part may have a press-fit hole into which the press-fit member is press-fitted.

When, for example, a press-fit member is directly press-fitted into a through-hole formed in a busbar, high dimensional accuracy is required, and thus the press-fitting is not easy. Also, if a press-fitting recess is provided in the busbar by cutting off an edge thereof, a predetermined range of the periphery of the press-fit member is press-fitted and the remaining part thereof is not in contact with the busbar, though the operation for press-fitting the press-fit member is easy compared to a case where it is press-fitted in its entire periphery, there is the problem that the retention force of the busbar when retaining the press-fit member is likely to deteriorate. According to this configuration, press-fitting of the press-fit member is easy because the press-fit member is press-fitted into the press-fit hole formed in the resin part, and at the same time, it is possible to suppress deterioration of the retention force of the busbar substrate when retaining the press-fit member because the press-fit member can be press-fitted in its entire periphery. Here, when press-fitting is performed on the resin part in such a manner, a configuration is such that a gap is created between the busbar and the press-fit member, and the busbar and the press-fit member are not in direct contact with each other, but electrical connection between the press-fit member and the busbar can be ensured by the solder accumulated in the solder accumulating portion.

An insulating substrate may be provided in which a conductive path is formed on an insulating plate, and that is laid on the busbar substrate, wherein the press-fit member has a thickness greater than a thickness of the busbar substrate, and a surface of the press-fit member to which the electronic component is connected is coplanar with a surface of the insulating substrate.

With this, it is possible to eliminate unevenness when lead terminals of the electronic component are connected to the press-fit member and the insulating substrate.

A plurality of the press-fit members are connected to one electronic component, the resin part may include a partition portion that separates the adjacent press-fit members from each other, and the partition portion may protrude from a surface of the resin part that is located on the upper side of the busbar.

With this, solder is suppressed from moving between the adjacent press-fit members by the partition portion, thus making it possible to ensure the insulation between the adjacent press-fit members.

An electrical junction box is provided that includes: the circuit assembly; and a casing in which the circuit assembly is housed.

Advantageous Effects of Invention

According to the technique described in the present specification, it is possible to improve the reliability in connection between a busbar and a press-fit member.

BRIEF DESCRIPTION OF DRAWINGS

FIG. 16 is a cross-sectional view of the circuit assembly, taken along the line D-D in FIG. 6.

DETAILED DESCRIPTION OF PREFERRED EMBODIMENTS

Embodiment 1

An electrical junction box 10 (FIG. 1) according to Embodiment 1 is installed, in vehicles such as electric automobiles or hybrid automobiles, on a pathway from a power source such as a battery to a load such as a motor, for example. Hereinafter, description will be given assuming that "X direction" is frontward, "Y direction" is leftward, and "Z direction" is upward.

Electrical Junction Box 10

Figure 2:
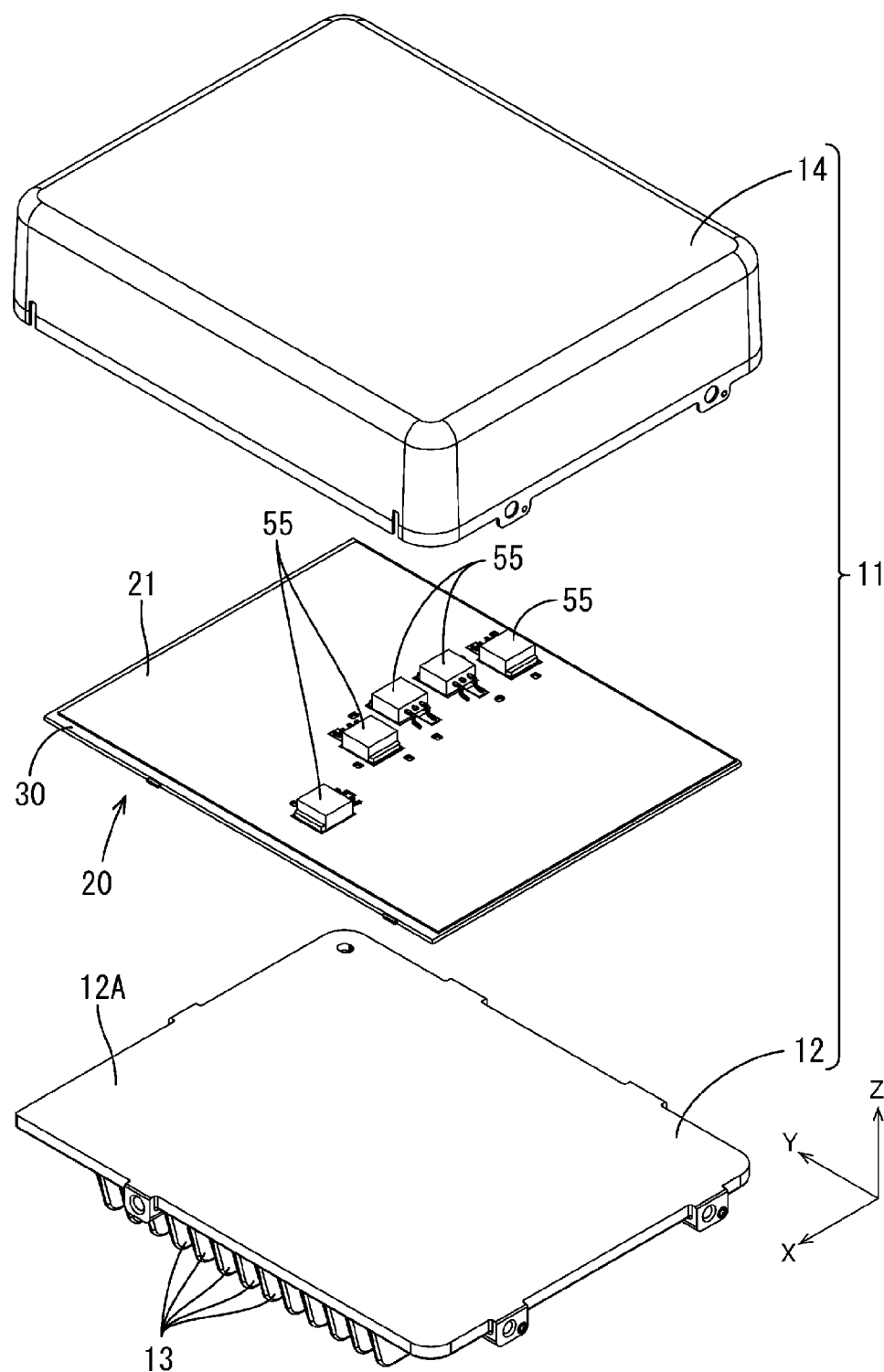
FIG. 2 is an exploded perspective view of the electrical junction box.

As shown in FIG. 2, the electrical junction box 10 is provided with a circuit assembly 20, and a casing 11 in which the circuit assembly 20 is housed. The casing 11 is made of metal such as aluminum or an aluminum alloy, and is provided with a heat discharge member 12 that discharges heat of the circuit assembly 20, and a cover 14 that covers the circuit assembly 20 from above.

The heat discharge member 12 has a flat upper side 12A, and a lower side on which a plurality of heat discharge fins 13 are formed in the shape of a comb. The circuit assembly 20 is bonded to the upper side 12A of the heat discharge member 12 with, for example, an insulating adhesive agent, adhesive sheet, or the like. Note that the circuit assembly 20 may also be screwed to the heat discharge member 12 with screws (not shown).

Circuit Assembly 20

Figure 3:
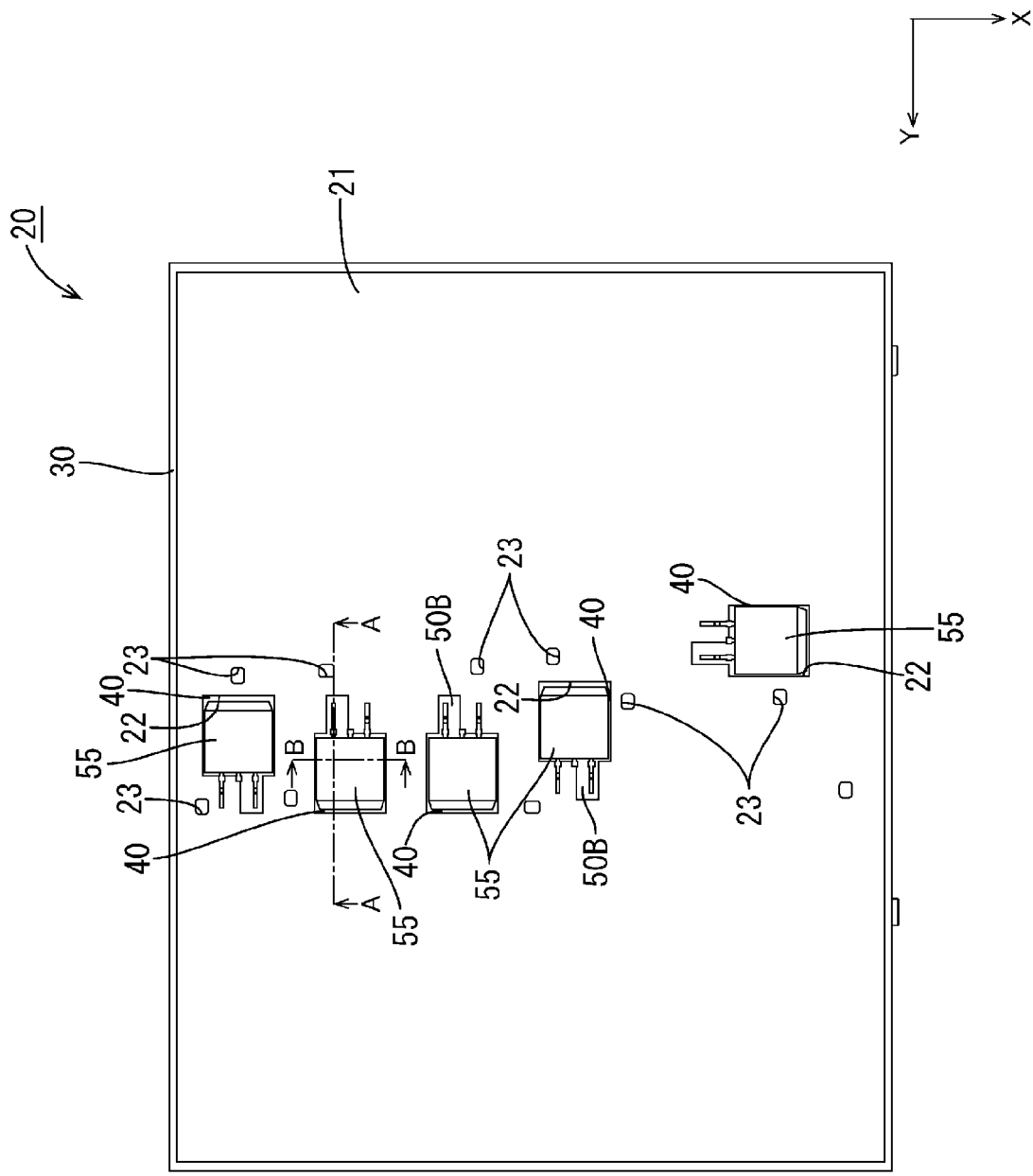
FIG. 3 is a plan view illustrating a circuit assembly.
Figure 4:
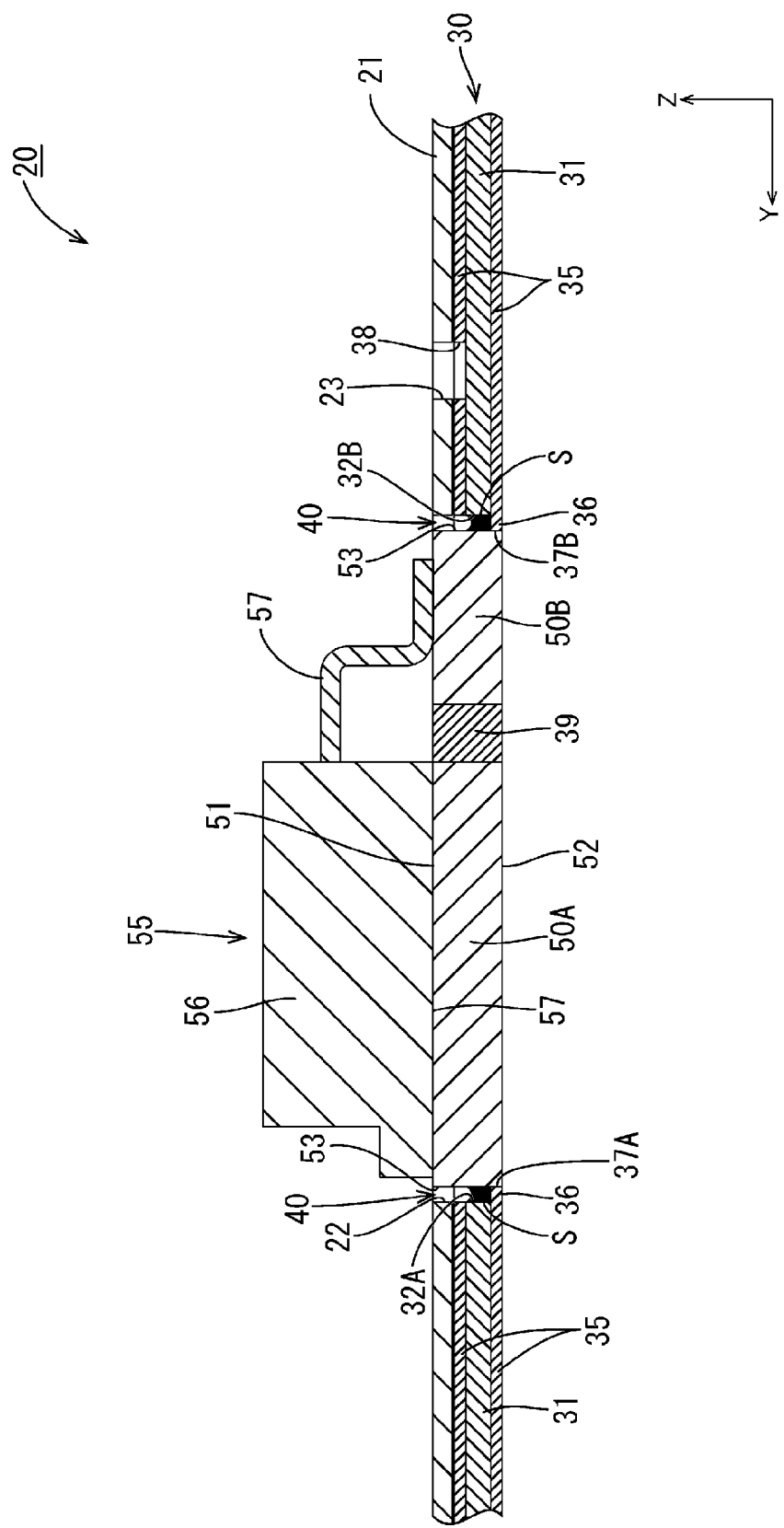
FIG. 4 is a cross-sectional view taken along a line A-A in FIG. 3.

As shown in FIGS. 3 and 4, the circuit assembly 20 is provided with an insulating substrate 21 in which a conductive path is formed on an insulating plate, a busbar substrate 30 on which the insulating substrate 21 is laid, press-fit members 50A and 50B press-fitted in the busbar substrate 30, and a plurality of electronic components 55 connected to the press-fit members 50A and 50B.

Insulating Substrate 21

The insulating substrate 21 has the shape of a substantially rectangular plate, and has a configuration in which a conductive path (not shown) made of a conductive material such as copper foil is formed, by printed wiring, on the upper side of an insulating plate made of an insulating material. The insulating substrate 21 has a plurality of insertion holes 22 into which the press-fit members 50A and 50B can be inserted, and a plurality of through-holes 23 for connecting the conductive path formed on the upper side of the insulating substrate 21 to busbars 31. The insulating substrate 21 is bonded to the busbar substrate 30 with an adhesive or the like.

Busbar Substrate 30

The busbar substrate 30 has the shape of a substantially rectangular plate, which overlaps the insulating substrate 21 almost entirely, and is provided with the plurality of busbars 31 and a resin part 35 that overlaps the plurality of busbars 31 while being in intimate (areal) contact therewith. The busbar substrate 30 can be formed by, for example, insert molding with the busbars 31 arranged inside a die.

Figure 9:
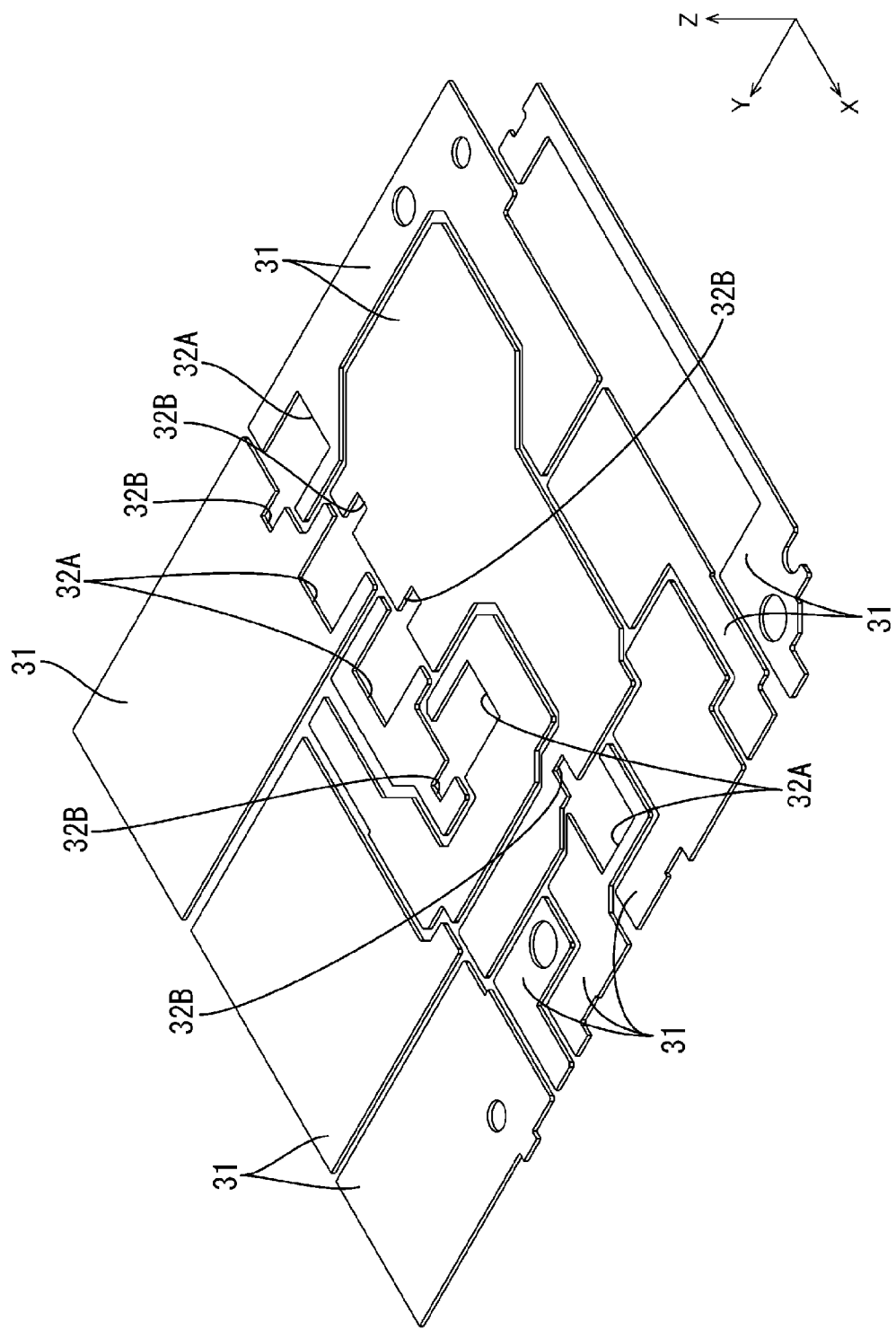
FIG. 9 is a perspective view illustrating a plurality of busbars.

The plurality of busbars 31 are formed by punching a metal plate material such as copper or a copper alloy into a conductive path shape using a pressing machine, and are arranged, as shown in FIG. 9, in different regions on the same plane with gaps interposed therebetween. Adjacent busbars 31 have insertion recesses 32A and 32B into which press-fit members 50A and 50B are inserted with a gap therebetween, the insertion recesses 32A and 32B being arranged opposite to each other.

Figure 7:
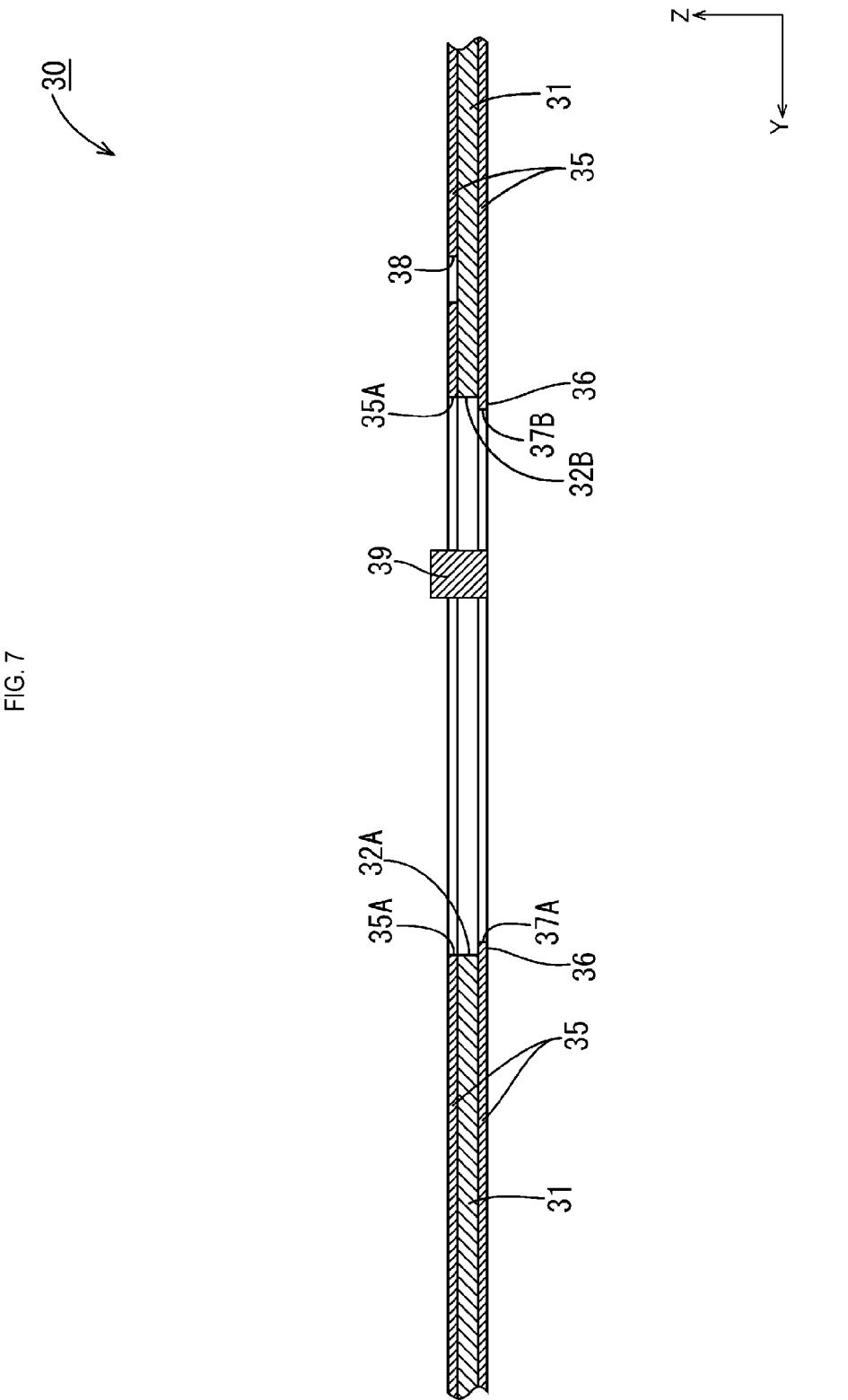
FIG. 7 is a cross-sectional view taken along a line C-C in FIG. 6.
Figure 8:
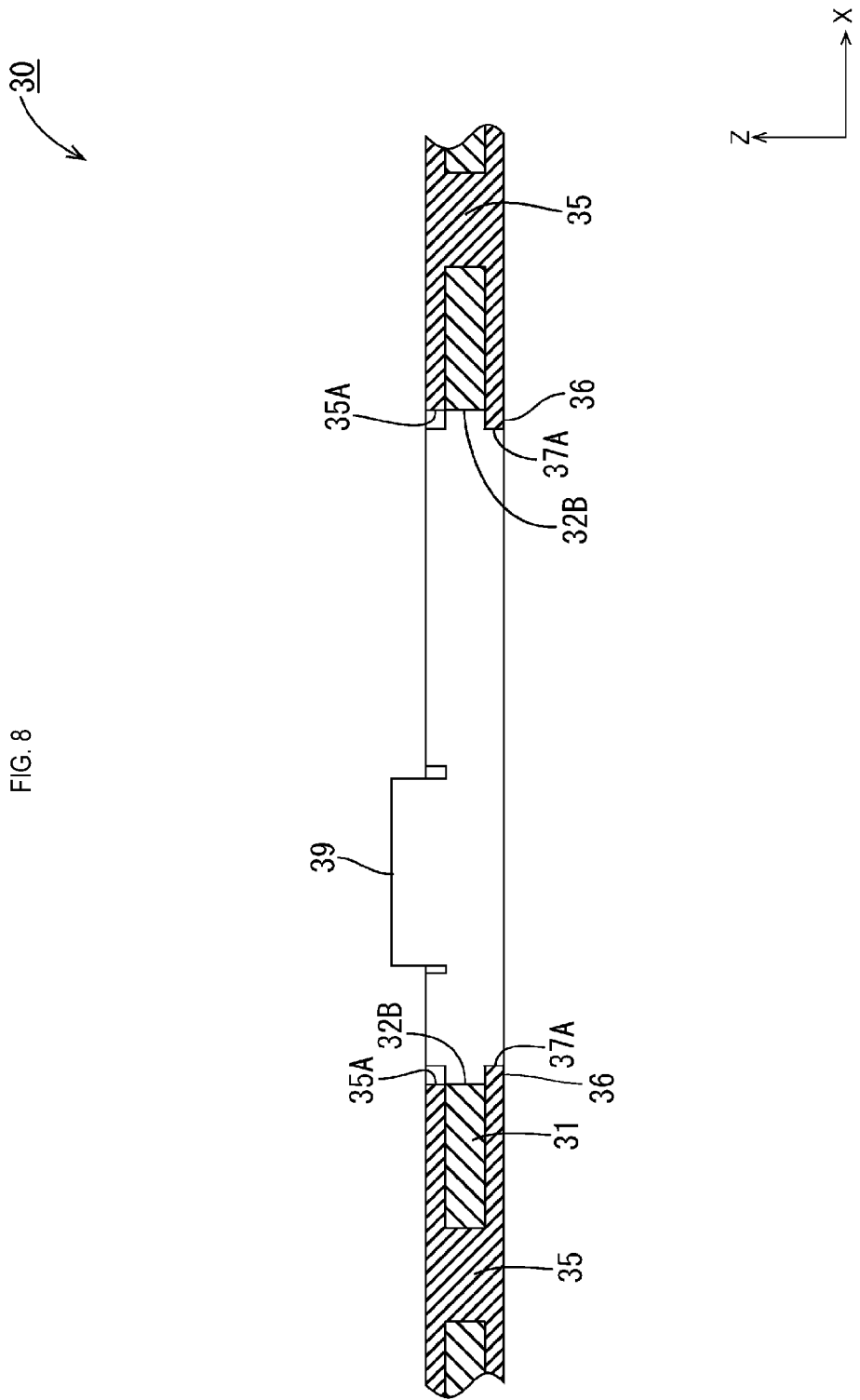
FIG. 8 is a cross-sectional view taken along a line D-D in FIG. 6.

The resin part 35 is made of an insulating synthetic resin such as an epoxy resin for example, and, as shown in FIGS. 7 and 8, the resin part 35 overlaps, with a predetermined thickness, the upper and lower side of the busbars 31, and fill up the gaps between adjacent busbars 31, except for the insertion recesses 32A and 32B. The portion of the resin part 35 that overlaps the upper side of the busbars 31 has a plurality of through-holes 38, which are formed through that portion and are configured to electrically connect the conductive path formed on the upper side of the insulating substrate 21 to the busbars 31 using soldering or the like. The portion of the resin part 35 that overlaps the lower side (one surfaces) of the busbars 31 has, at positions that overlap the insertion recesses 32A and 32B of the busbars 31, protrusion portions 36 that protrude beyond the busbars 31 (toward the press-fit member 50A, 50B). Each protrusion portion 36 extends from the end edge of an insertion recess 32A or 32B to the outside, and the end edge of the protrusion portion 36 serves as the hole edge of a rectangular press-fit hole 37A or 37B into which the press-fit member 50A or 50B is press-fitted. The press-fit holes 37A and 37B have such a size that the press-fit members 50A and 50B are respectively press-fitted with almost no gap, and the press-fit holes 37A and 37B are formed through the busbar substrate 30.

Two adjacent press-fit holes 37A and 37B have sizes different from each other. The resin part 35 includes partition portions 39 each arranged in a gap between adjacent press-fit members 50A and 50B to separate the adjacent press-fit members 50A and 50B from each other. The partition portions 39 are plate-shaped (wall-shaped), and have a thickness that is substantially the same as the thickness of the press-fit members 50A and 50B. The upper edges of the partition portions 39 are located above the upper side of the resin part 35 that overlaps the upper side (on the electronic component 55 side) of the busbars 31, and are formed so as to be coplanar with the upper side of the press-fit members 50A and 50B, and the upper side of the insulating substrate 21. Furthermore, the lower edges of the partition portions 39 are formed so as to be coplanar with the lower side of the press-fit members 50A and 50B, and the lower side of the resin part 35 that overlaps the lower side of the busbars 31.

Figure 5:
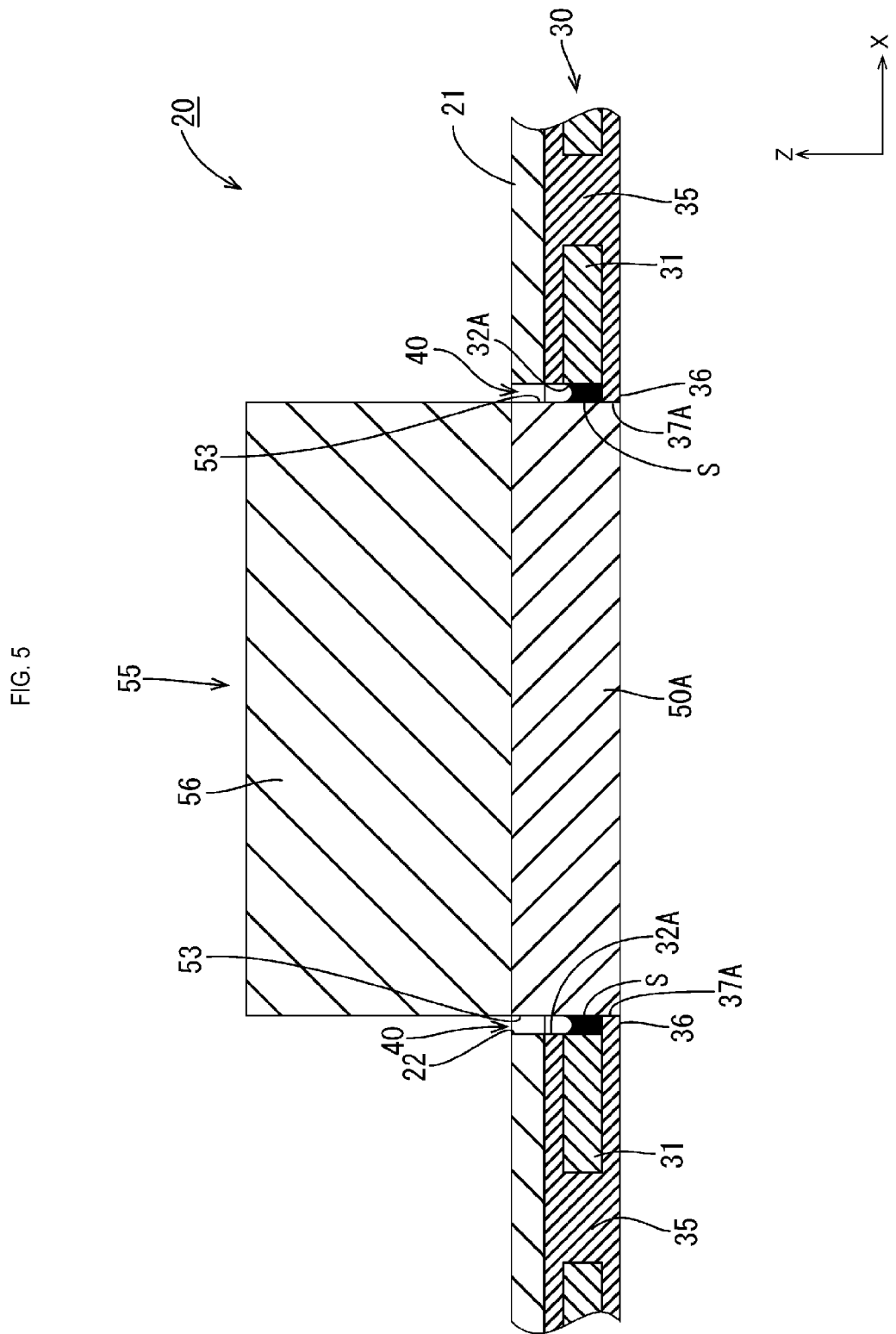
FIG. 5 is a cross-sectional view taken along a line B-B in FIG. 3.
Figure 6:
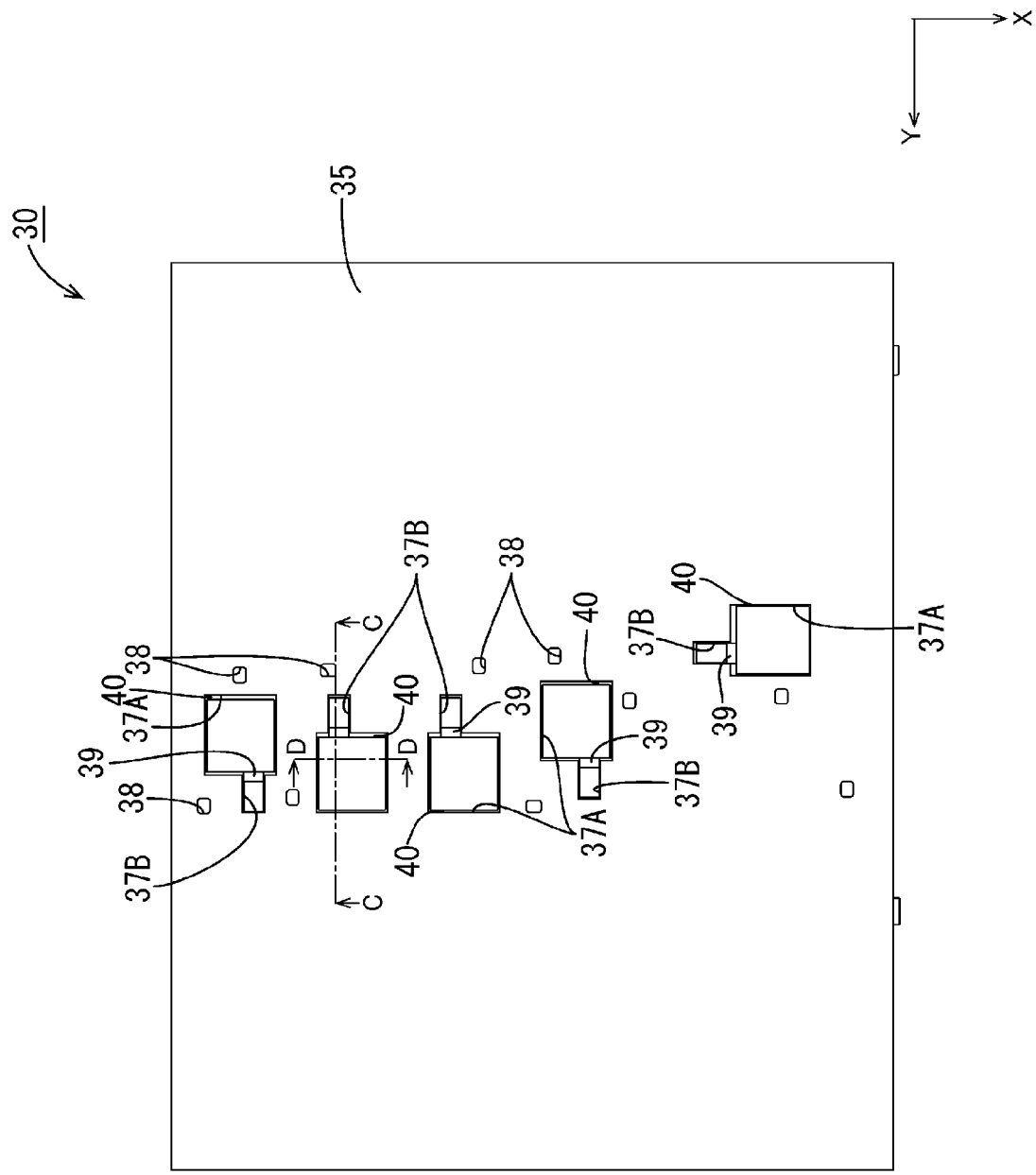
FIG. 6 is a plan view illustrating a busbar substrate.

As shown in FIGS. 4 and 5, solder accumulating portions 40 in which solder S is accumulated are provided, each solder accumulating portions 40 being constituted by a protrusion portion 36, a side surface 53 of a press-fit member 50A or 50B, and an insertion recess 32A or 32B of a busbar 31. The solder accumulating portion 40 extends in the shape of a groove along the peripheral edge of the press-fit member 50A or 50B (end edge of the insertion recess 32A or 32B), and has a groove bottom formed by the upper side of the protrusion portion 36, and a pair of groove walls formed by the side surface 53 of the press-fit member 50A or 50B and the insertion recess 32A or 32B, the pair of groove walls standing upright from the groove bottom. Note that the solder accumulating portion 40 is formed on the entire periphery of the press-fit member 50A or 50B, except for the side at which the press-fit member 50A or 50B is in contact with the partition portion 39.

The solder S accumulated in the solder accumulating portion 40 extends circularly around the press-fit member 50A or 50B (except for the partition portion 39), and electrically connects the gap between the press-fit member 50A or 50B, and the busbar 31. The solder S may also be a lead-free solder, for example.

Press-Fit Members 50A and 50B

The press-fit members 50A and 50B are formed by punching a metal plate material such as copper or a copper alloy (for example, the same metal as the metal of the busbars 31) using a pressing machine, and has the shape of a substantially rectangular plate with almost the same thickness as the thickness of an overlap of the insulating substrate 21 and the busbar substrate 30. The lower edges of the press-fit members 50A and 50B are press-fitted into the press-fit holes 37A and 37B of the resin part 35.

Electronic Components 55

The electronic components 55 are semiconductor switching elements such as field effect transistors (FETs) for example, and are heat generation members that generate heat depending on the current flowing through them. Each of the electronic components 55 includes a body 56 with a box-shaped package, and a plurality of lead terminals 57. One of the plurality of lead terminals 57 is provided on the bottom of the body 56, and the remaining lead terminals 57 protrude from a side surface of the body 56. The plurality of lead terminals 57 are soldered to the press-fit members 50A and 50B, and the conductive path formed on the upper side of the insulating substrate 21.

A process for manufacturing the electrical junction box 10 will be described.

Figure 10:
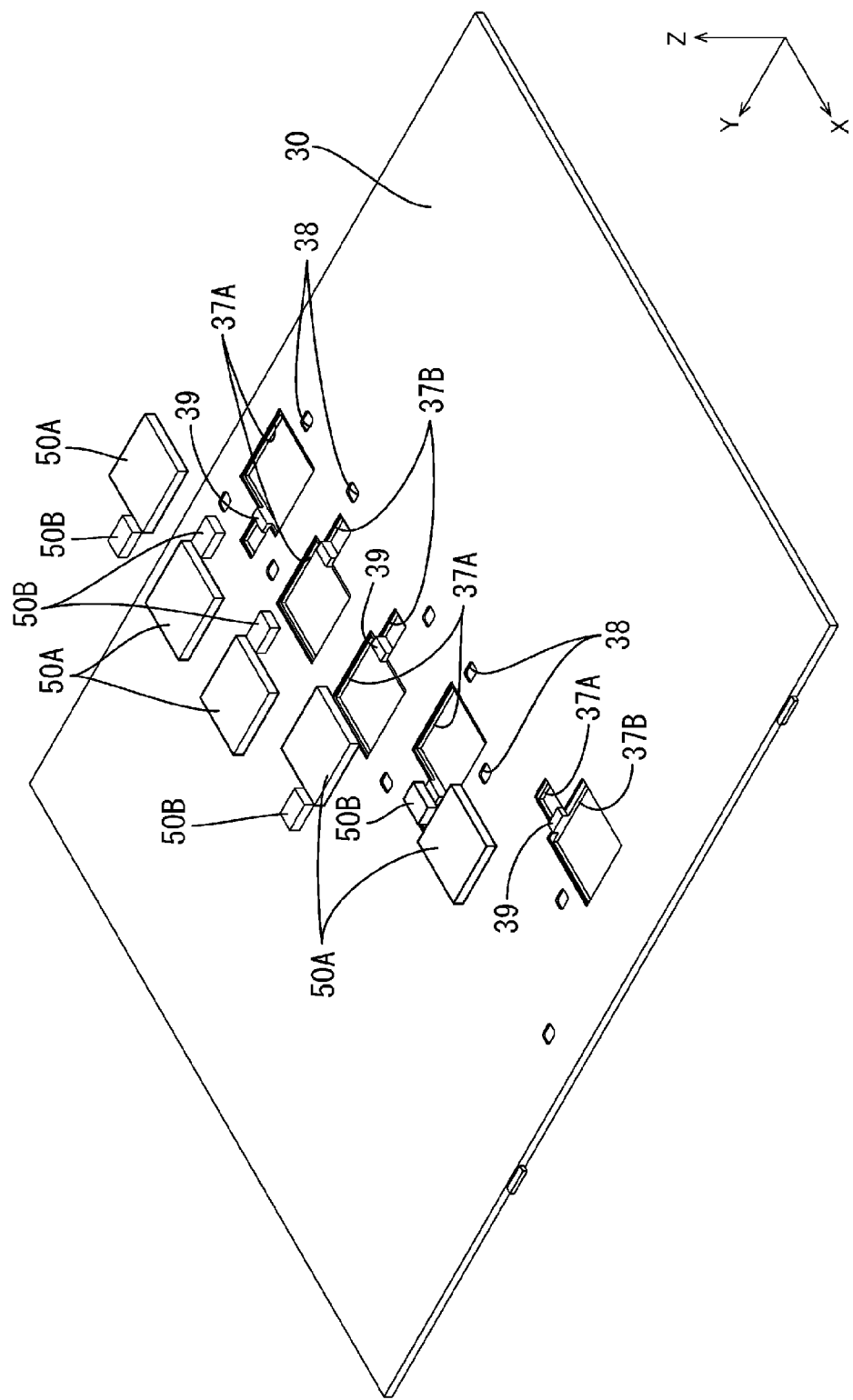
FIG. 10 is a perspective view illustrating a process in which press-fit members are press-fitted into the busbar substrate.
Figure 11:
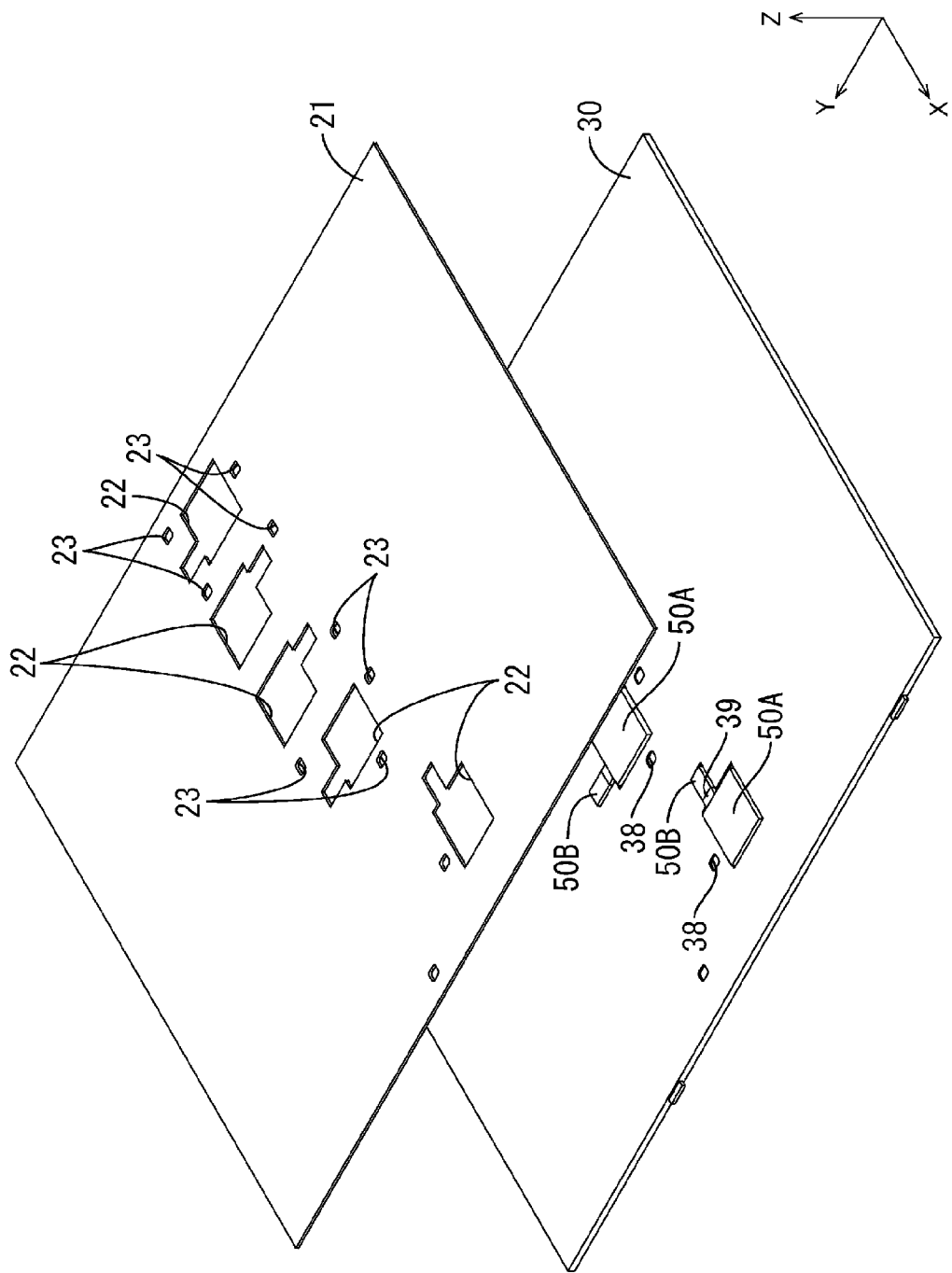
FIG. 11 is a perspective view illustrating a process in which an insulating substrate and the busbar substrate are bonded to each other.
Figure 12:
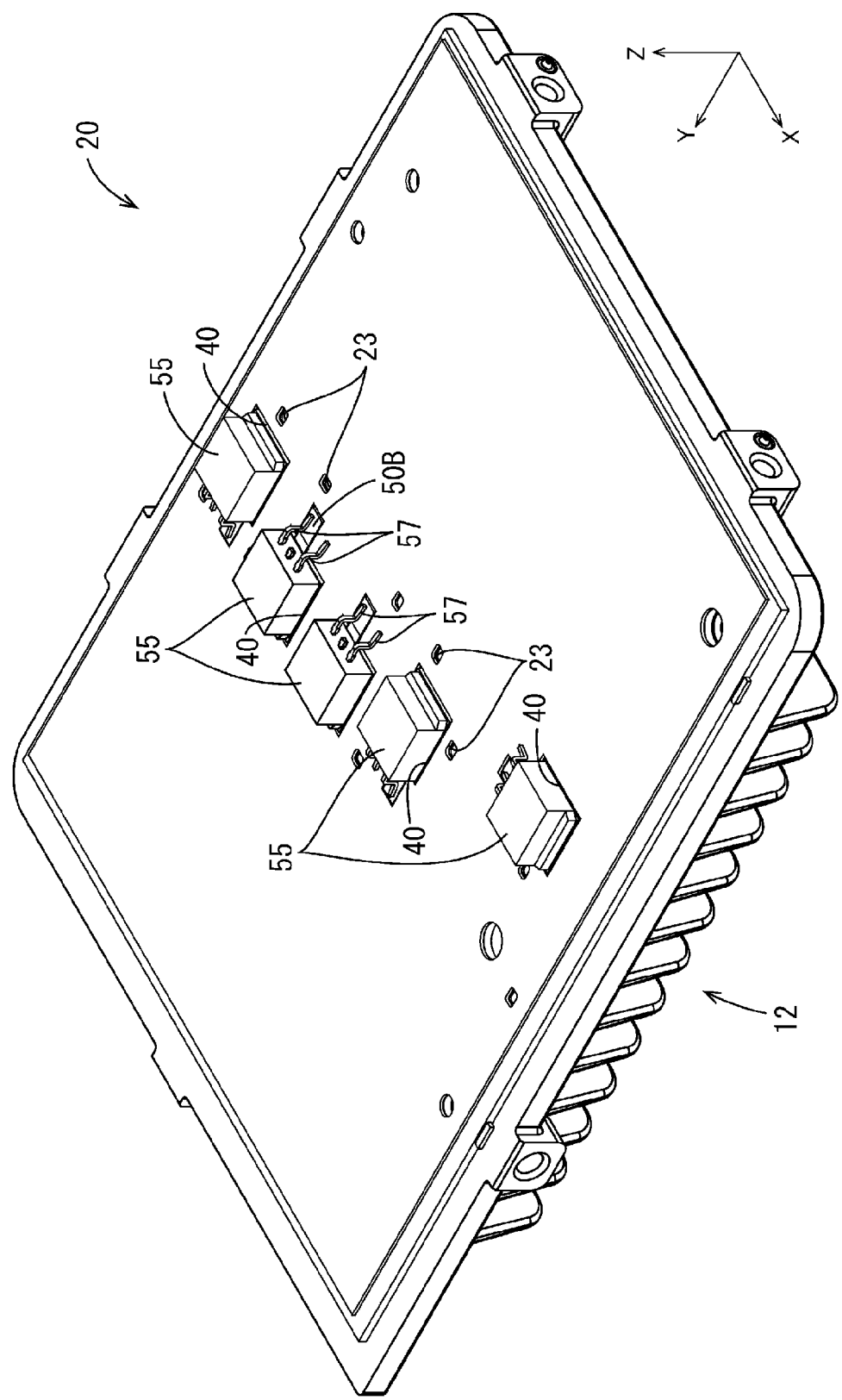
FIG. 12 is a perspective view illustrating a state in which the circuit assembly is intimately attached to the upper side of a heat discharge member via an insulating layer.

The plurality of busbars 31 are formed by subjecting a metal plate material to pressing processing or the like (FIG. 9). Then, by performing insert molding with the busbars 31 arranged inside a die, the busbar substrate 30 is formed. Then, as shown in FIG. 10, the press-fit members 50A and 50B are press-fitted into the plurality of press-fit holes 37A and 37B formed in the busbar substrate 30. Then, as shown in FIG. 12, the insulating substrate 21 is bonded to the upper side of the busbar substrate 30 with an adhesive.

Figure 1:
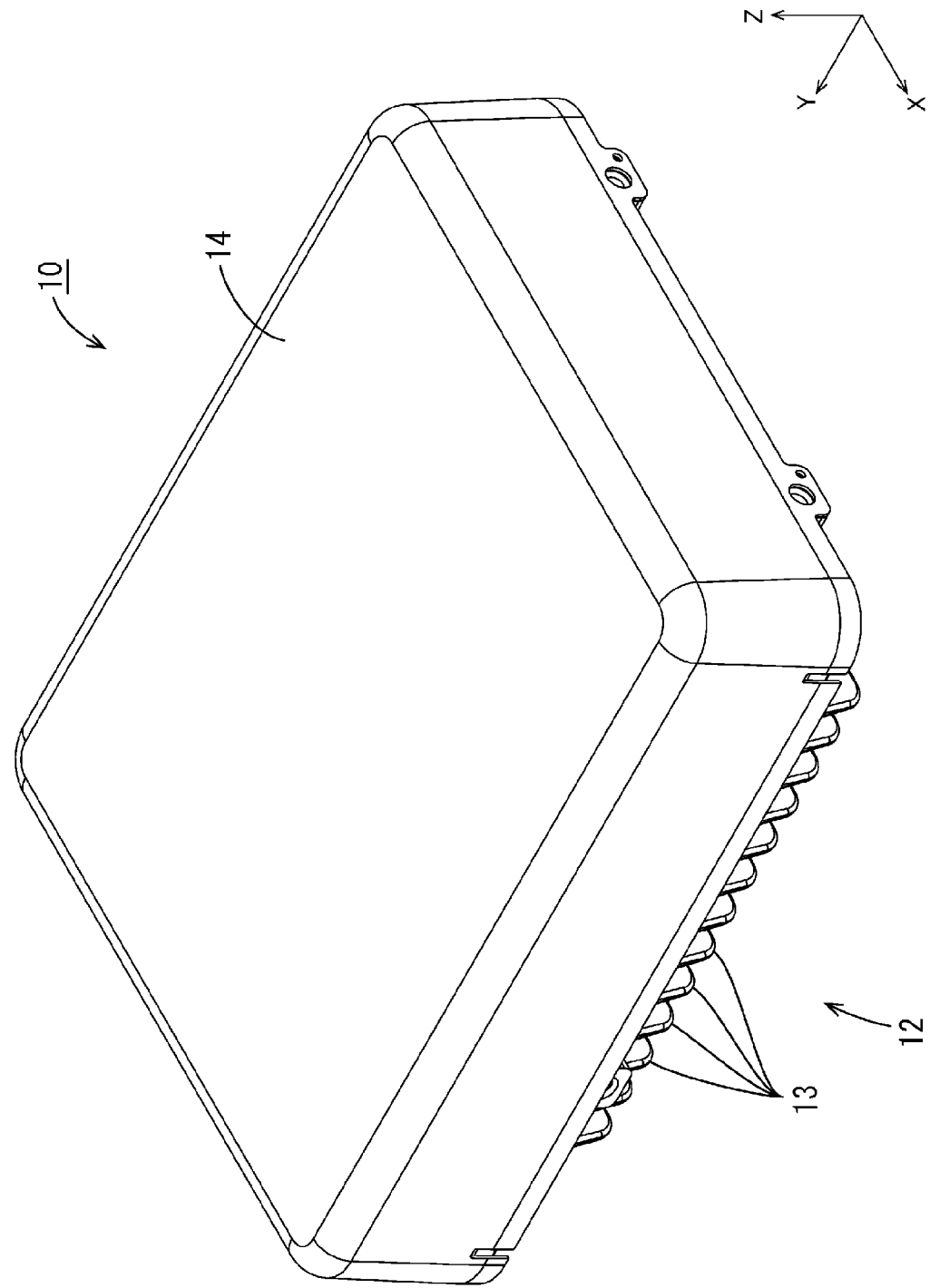
FIG. 1 is a perspective view illustrating an electrical junction box according to Embodiment 1.

Then, for example, cream solder is applied to the solder accumulating portions 40 and the upper side of the press-fit members 50A and 50B, the plurality of electronic components 55 are placed on the press-fit members 50A and 50B, and reflow soldering is performed thereon. Accordingly, the cream solder melts and reaches the entirety (entire length) of the solder accumulating portions 40, so that the busbars 31 and the press-fit members 50A and 50B are connected to each other by the solder, and the lead terminals 57 of the electronic components 55 are soldered to the press-fit members 50A and 50B. Thus, the circuit assembly 20 is formed (FIG. 3). Then, the circuit assembly 20 is bonded to the upper side of the heat discharge member 12 with an adhesive or the like (FIG. 12), and the cover 14 is put over and screwed to the heat discharge member 12 using screws (not shown), thus resulting in the electrical junction box 10 (FIG. 1).

According to the above-described embodiment, the following functions and effects can be achieved.

The circuit assembly 20 is provided with the busbar substrate 30 having the busbars 31 and the resin part 35 that is in intimate contact with the busbars 31, the press-fit members 50A and 50B that are made of metal and are press-fitted in the busbar substrate 30, the electronic components 55 connected to the press-fit members 50A and 50B, the solder S that connects the busbars 31 and the press-fit members 50A and 50B, and the solder accumulating portions 40 that are formed with the resin part 35 and in which the solder S is accumulated.

According to the present embodiment, the busbars 31 and the press-fit members 50A and 50B are connected to each other via the solder S accumulated in the solder accumulating portions 40, and thus it is possible to improve the reliability in the connection between the busbars 31 and the press-fit members 50A and 50B that are press-fitted in the busbars 31. Furthermore, the solder accumulating portions 40 are formed with the resin part 35 that is in intimate contact with the busbars 31, and thus it is possible to easily form the solder accumulating portions 40, and easily change the shape of the solder accumulating portions 40, so that the degree of freedom in design can increase.

Furthermore, the resin part 35 includes the protrusion portions 36 protruding from the end edges of the busbars 31 beyond the busbars 31, and the press-fit members 50A and 50B are press-fitted to the protrusion portions 36.

With this, it is possible to suppress a press-fitting defect that may occur due to an error in assembly accuracy, compared to a configuration in which the press-fit members 50A and 50B are directly press-fitted to the busbars 31.

Furthermore, the resin part 35 has the press-fit holes 37A and 37B into which the press-fit members 50A and 50B are press-fitted.

When, for example, the press-fit members 50A and 50B are directly press-fitted into through-holes formed in the busbars 31, high dimensional accuracy is required, and thus the press-fitting is not easy. Also, if press-fitting recesses are provided in the busbars 31 by cutting off edges thereof, and part of the peripheries of the press-fit members 50A and 50B is press-fitted and the remaining part thereof is not in contact with the busbars 31, though the operation for press-fitting the press-fit members 50A and 50B is easy, there is the problem that the retention force of the busbars 31 when retaining the press-fit members 50A and 50B is likely to deteriorate. According to the present embodiment, press-fitting of the press-fit members 50A and 50B is easy because the press-fit members 50A and 50B are press-fitted into the press-fit holes 37A and 37B formed in the resin part 35, and at the same time, it is possible to suppress deterioration of the retention force of the busbar substrate 30 when retaining the press-fit members 50A and 50B because the press-fit members 50A and 50B can be press-fitted in their entire periphery. Here, when press-fitting is performed on the resin part 35 in such a manner, a configuration is such that a gap is created between the busbars 31 and the press-fit members 50A and 50B, and the busbars 31 and the press-fit members 50A and 50B are not in direct contact with each other, but electrical connection between the press-fit members 50A and 50B and the busbars 31 can be ensured by the solder S accumulated in the solder accumulating portions 40.

Furthermore, the insulating substrate 21 in which a conductive path is formed on an insulating plate, and that is laid on the busbar substrate 30 is provided. The press-fit members 50A and 50B have a thickness greater than the thickness of the busbar substrate 30, and the surfaces of the press-fit members 50A and 50B to which the electronic components 55 are connected are coplanar with a surface of the insulating substrate 21.

With this, it is possible to eliminate unevenness when the lead terminals 57 of the electronic components 55 are connected to the press-fit members 50A and 50B, and the insulating substrate 21.

Furthermore, the plurality of press-fit members 50A and 50B that are connected to a single electronic component 55 are provided, the resin part 35 includes a partition portion 39 that separates the adjacent press-fit members 50A and 50B from each other, and the partition portion 39 protrudes from the surface of the resin part 35 located on the upper side of the busbars 31.

With this, the solder S is suppressed from moving between the adjacent press-fit members 50A and 50B by the partition portion 39, thus making it possible to ensure the insulation between the adjacent press-fit members 50A and 50B.

Embodiment 2

Figure 13:
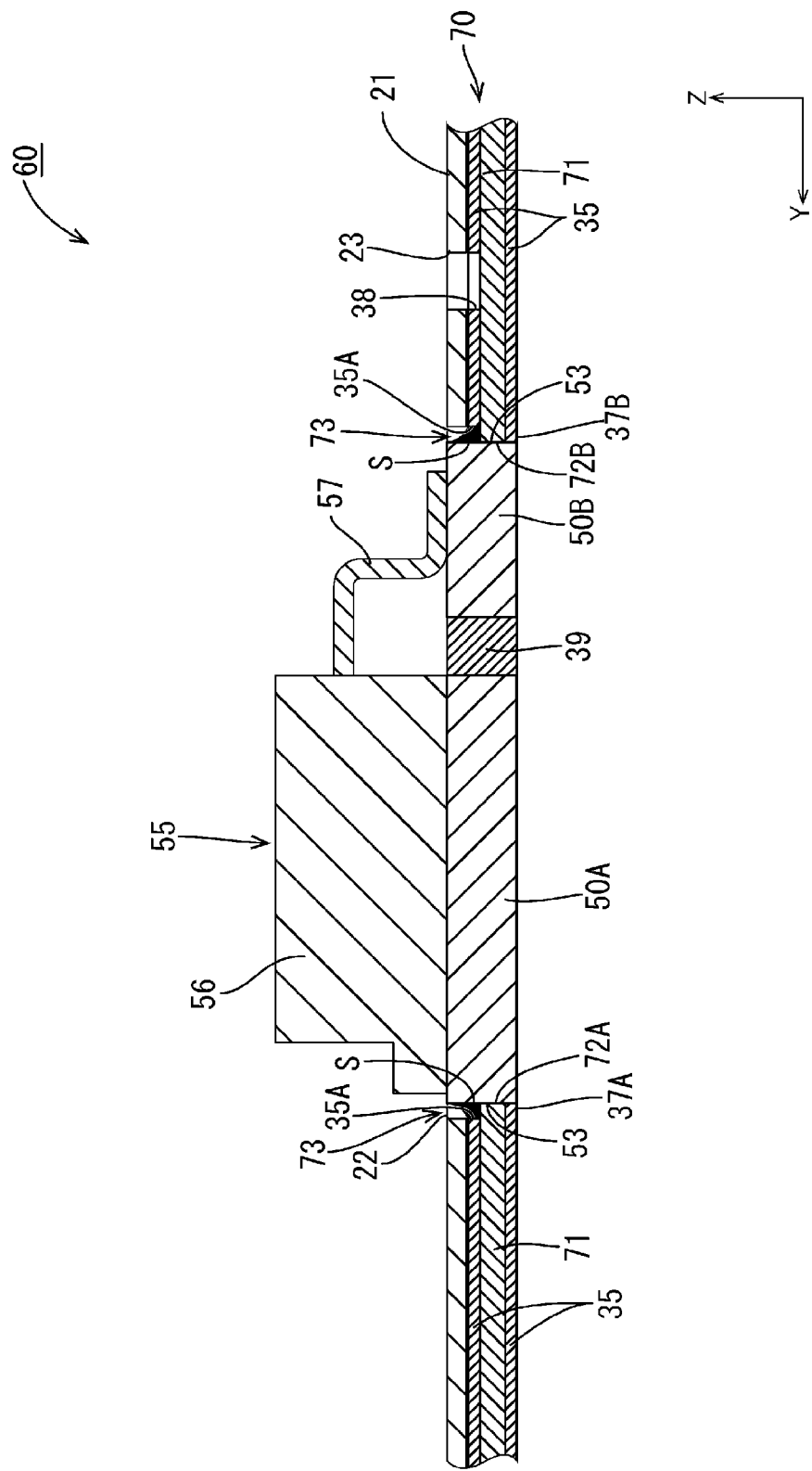
FIG. 13 is a cross-sectional view of a circuit assembly according to Embodiment 2, taken along the line A-A in FIG. 3.
Figure 14:
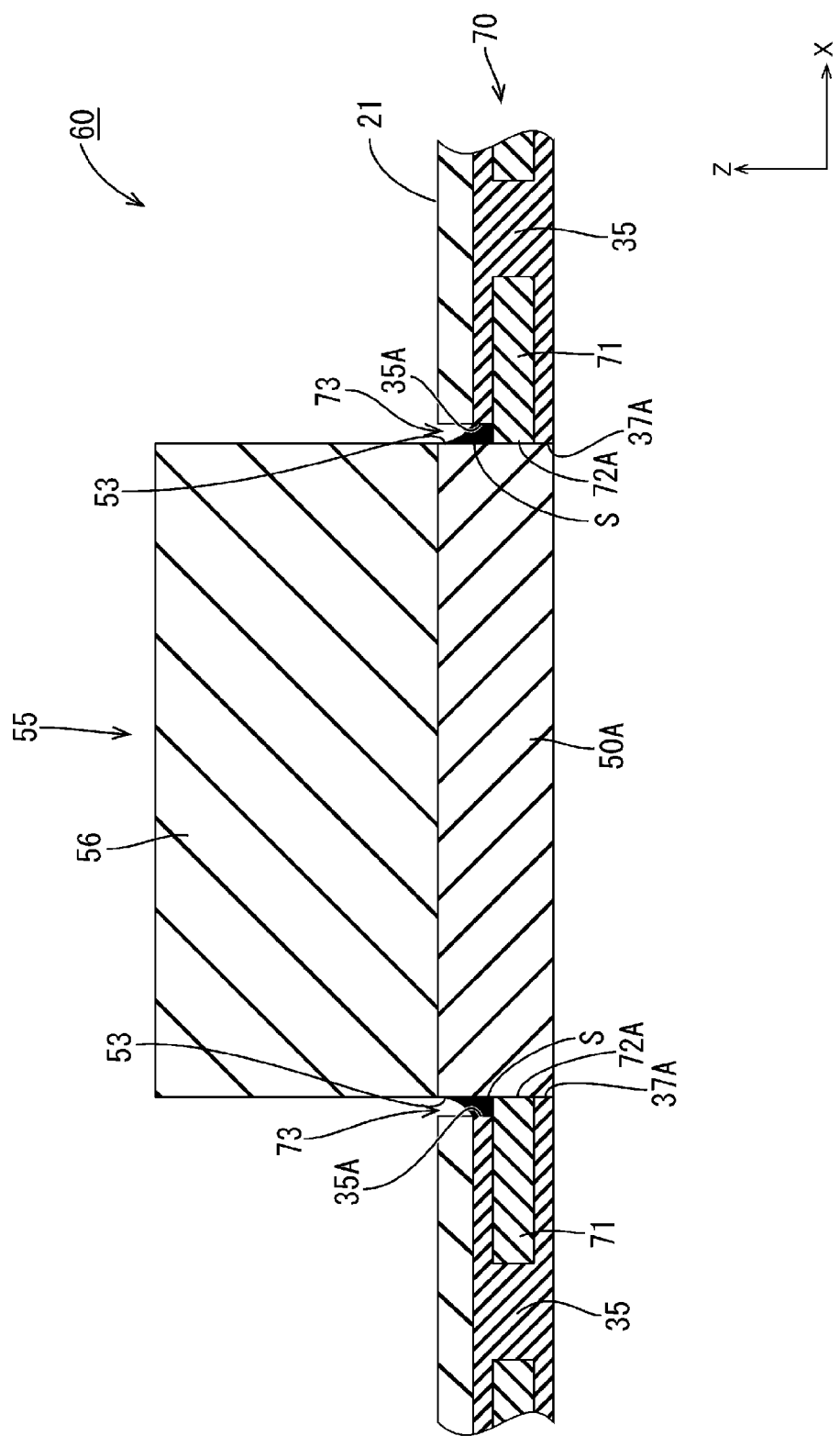
FIG. 14 is a cross-sectional view of the circuit assembly, taken along the line B-B in FIG. 3.
Figure 15:
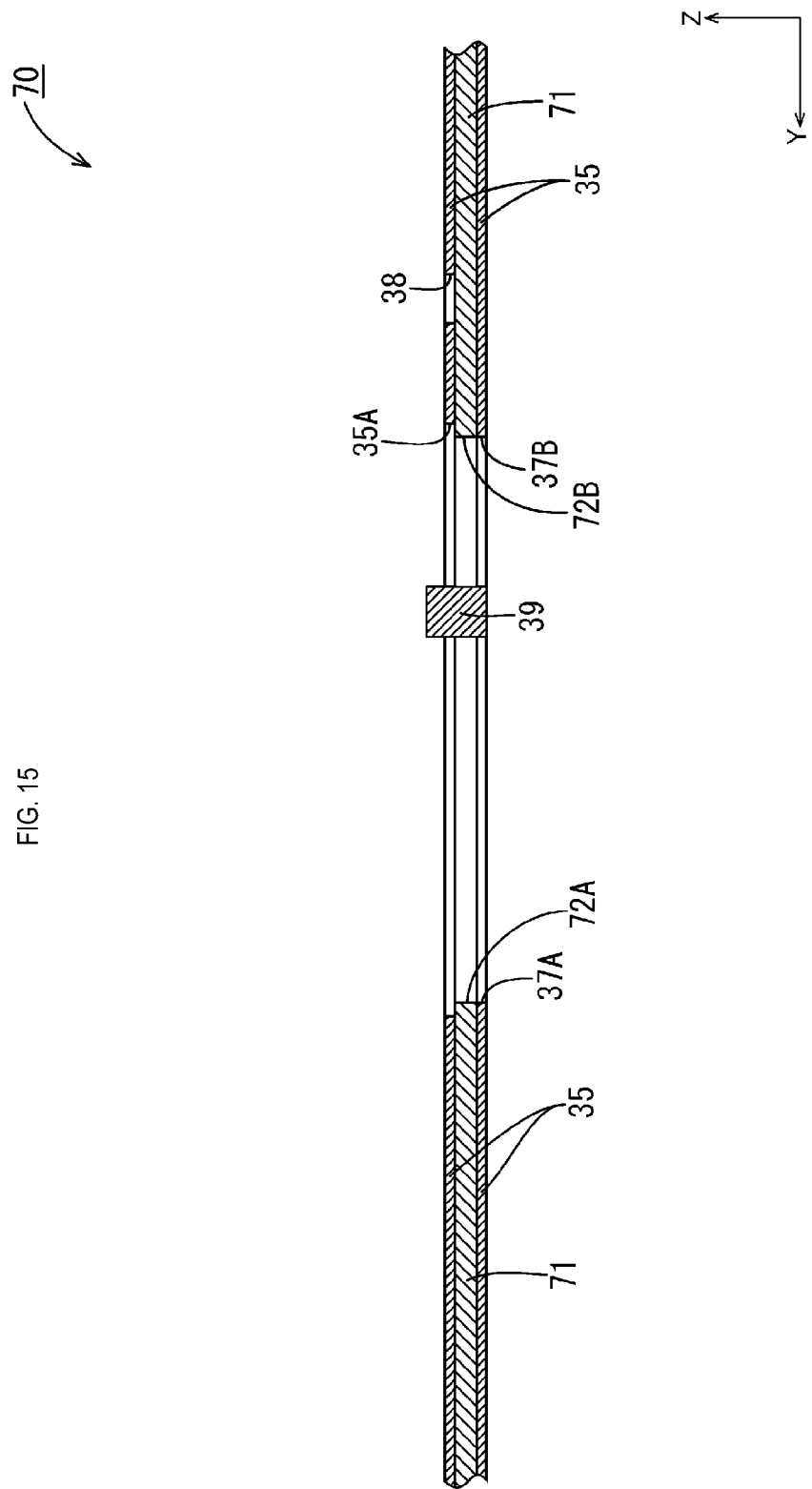
FIG. 15 is a cross-sectional view of the circuit assembly, taken along the line C-C in FIG. 6.

Embodiment 2 will be described with reference to FIGS. 13 to 16. In Embodiment 1, the press-fit members 50A and 50B are configured to be press-fitted into the press-fit holes 37A and 37B formed in the resin part 35, but in Embodiment 2, as shown in FIG. 13, the press-fit members 50A and 50B are configured to be press-fitted into press-fitting recesses 72A and 72B formed in the busbars 71, and solder accumulating portions 73 are formed each of which has a groove bottom formed by the upper side of a busbar 71. Other configurations are the same as those of Embodiment 1, and thus in the following, the same reference numerals are given to the same configurations as those of Embodiment 1, and descriptions thereof are omitted.

A circuit assembly 60 is provided with an insulating substrate 21, a busbar substrate 70 on which the insulating substrate 21 is laid, press-fit members 50A and 50B that are press-fitted in the busbar substrate 70, and a plurality of electronic components 55. The busbar substrate 70 is provided with a plurality of busbars 71, and a resin part 35 that is in intimate contact with the plurality of busbars 71.

The busbars 71 have the press-fitting recesses 72A and 72B into which the press-fit members 50A and 50B are press-fitted. The press-fitting recesses 72A and 72B have a shape that is cut out into a rectangle with a size such that three of the sides of the press-fit members 50A and 50B can be press-fitted (a shape in which their inner spaces are slightly smaller than the insertion recesses 32A and 32B). End portions 35A of the resin part 35 that is in intimate contact with the upper side of the busbars 71 have a gap to the side surfaces 53 of the press-fit members 50A and 50B. Accordingly, solder accumulating portions 73 in which solder S is accumulated are formed, each solder accumulating portion 73 having a groove bottom formed by the upper side of a busbar 71 (on the press-fitting recess 72A, 72B side) and a pair of groove walls formed by the side surface 53 of a press-fit member 50A or 50B and an end portion 35A of the resin part 35, the pair of groove walls standing upright from the groove bottom. The solder accumulating portion 73 extends circularly in the shape of a groove along the peripheral edge of the corresponding press-fit member 50A or 50B (except for the partition portion 39).

According to Embodiment 2, the busbars 71 and the press-fit members 50A and 50B are connected to each other via the solder S accumulated in the solder accumulating portions 73, and the metal of the busbars 71 and the metal of the press-fit members 50A and 50B are directly connected to each other, thus making it possible to improve the reliability in electrical connection.

Other Embodiments

The technique described in the present specification is not limited to the embodiments described in the above description with reference to the drawings, and the technical scope of the technique described in the present specification encompasses, for example, the following embodiments.

The shape and number of press-fit members 50A and 50B are not limited to the shape and number in the foregoing embodiments. For example, the shape is not limited to a rectangle as in the foregoing embodiments, and may also be a circle, oval, or polygon. Furthermore, the shape of the solder accumulating portions may be modified as appropriate depending on the shape of the press-fit members.

The insulating substrate 21 may also be a multi-layer substrate in which one or more conductive paths are stacked on each other.

In the circuit assembly 20, the insulating substrate 21 and the busbar substrate 30 constitute a circuit substrate, but the present invention is not limited to this, and a configuration is also possible in which the insulating substrate 21 is not provided and only the busbar substrate 30 functions as a circuit substrate.

FETs are used as the electronic components 55, but the present invention is not limited to this, and, for example, coils or capacitors may also be used as the electronic components 55.

Soldering for connecting the busbars 31 or 71 and the press-fit members 50A and 50B is not limited to reflow soldering, and various types of well-known methods may also be used as soldering.

The invention claimed is:

1. A circuit assembly comprising:
   a busbar substrate with a plurality of busbars arranged in different regions with gaps interposed therebetween and a resin part that is in intimate contact with upper and lower sides of the busbars, the resin part filling up the gaps between adjacent busbars;

a press-fit member that is made of metal and is press-fitted in the busbar substrate;

an electronic component connected to the press-fit member;

solder that connects the busbars and the press-fit member; and a solder accumulating portion that is formed with the resin part and in which the solder is accumulated.

2. The circuit assembly according to claim 1, wherein the resin part includes a protrusion portion that protrudes from an end edge of the busbar beyond the busbar, and the press-fit member is press-fitted to the protrusion portion.

3. The circuit assembly according to claim 2, wherein the resin part has a press-fit hole into which the press-fit member is press-fitted.

4. The circuit assembly according to claim 1, wherein the resin part has a press-fit hole into which the press-fit member is press-fitted.

5. An electrical junction box comprising:
the circuit assembly according to claim 1; and
a casing in which the circuit assembly is housed.

6. The electrical junction box as set forth in claim 5, wherein the resin part includes a protrusion portion that protrudes from an end edge of the busbar beyond the busbar, and the press-fit member is press-fitted to the protrusion portion.

7. The electrical junction box as set forth in claim 5, wherein the resin part has a press-fit hole into which the press-fit member is press-fitted.

8. A circuit assembly comprising:
a busbar substrate with a busbar and a resin part that is in intimate contact with the busbar;
a press-fit member that is made of metal and is press-fitted in the busbar substrate;
an electronic component connected to the press-fit member;
solder that connects the busbar and the press-fit member;
a solder accumulating portion that is formed with the resin part and in which the solder is accumulated; and
an insulating substrate in which a conductive path is formed on an insulating plate, and that is laid on the busbar substrate,
wherein the press-fit member has a thickness greater than a thickness of the busbar substrate, and a surface of the press-fit member to which the electronic component is connected is coplanar with a surface of the insulating substrate.

9. A circuit assembly comprising:
a busbar substrate with a busbar and a resin part that is in intimate contact with the busbar;
a plurality of press-fit members that are made of metal and are press-fitted in the busbar substrate;
an electronic component connected to the plurality of press-fit members;
solder that connects the busbar and the press-fit members; and
a solder accumulating portion that is formed with the resin part and in which the solder is accumulated,
wherein the plurality of press-fit members are connected to one electronic component,
the resin part includes a partition portion that separates the adjacent press-fit members from each other, and
the partition portion protrudes from a surface of the resin part that is located on the upper side of the busbar.

* * * * *